US011979194B2

(12) United States Patent
Ooi et al.

(10) Patent No.: US 11,979,194 B2
(45) Date of Patent: May 7, 2024

(54) LARGE-AREA WAVEGUIDED PHOTODETECTION FOR OPTICAL WIRELESS COMMUNICATION

(71) Applicant: KING ABDULLAH UNIVERSITY OF SCIENCE AND TECHNOLOGY, Thuwal (SA)

(72) Inventors: Boon Siew Ooi, Thuwal (SA); Chun Hong Kang, Thuwal (SB); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 11 days.

(21) Appl. No.: 17/422,939

(22) PCT Filed: Feb. 19, 2020

(86) PCT No.: PCT/IB2020/051392
§ 371 (c)(1),
(2) Date: Jul. 14, 2021

(87) PCT Pub. No.: WO2020/170166
PCT Pub. Date: Aug. 27, 2020

(65) Prior Publication Data
US 2022/0094441 A1    Mar. 24, 2022

Related U.S. Application Data

(60) Provisional application No. 62/808,585, filed on Feb. 21, 2019.

(51) Int. Cl.
*H04B 10/61* (2013.01)
*F21V 8/00* (2006.01)
(Continued)

(52) U.S. Cl.
CPC ......... *H04B 10/616* (2013.01); *G02B 6/0003* (2013.01); *G02B 6/102* (2013.01);
(Continued)

(58) Field of Classification Search
CPC .. H04B 10/616; H04B 10/116; G02B 6/0003; G02B 6/102; G02B 6/12004; G02B 2006/12195
See application file for complete search history.

(56) References Cited

U.S. PATENT DOCUMENTS 5,224,195 A * 6/1993 Yoshida ................. G02F 1/377
385/129
5,838,870 A * 11/1998 Soref ................. G02B 6/12004
385/132
(Continued)

FOREIGN PATENT DOCUMENTS

EP        3279556 A1    2/2018
WO    2018015725 A1    1/2018

OTHER PUBLICATIONS

Gao-Lingyang, "Organometal halide perovskite quantum dots: synthesis, optical properties, and display applications", Jul. 11, 2016, Elsevier, All Pages (Year: 2016).*
(Continued)

*Primary Examiner* — Pranesh K Barua
(74) *Attorney, Agent, or Firm* — PATENT PORTFOLIO BUILDERS PLLC

(57) ABSTRACT

A large-area, waveguide-based, high-speed ultraviolet and visible light photodetector system for optical wireless communication includes a substrate; plural, parallel, waveguides formed directly on the substrate and including a high quantum-yield wavelength-converting material of semiconductor nature; an optical coupling system optically connected to each one of the plural, parallel, waveguides; and a photodetector optically connected to the optical coupling system
(Continued)

and configured to detect an outgoing light. The wavelength-converting material converts a first wavelength of an incoming light at high-speed, received by the plural, parallel, waveguides, into a second wavelength of the outgoing light. The first wavelength is different from the second wavelength, and the first and second wavelengths are between 200 and 800 nm.

14 Claims, 10 Drawing Sheets

(51) Int. Cl.
 *G02B 6/10* (2006.01)
 *G02B 6/12* (2006.01)
 *H04B 10/116* (2013.01)
(52) U.S. Cl.
 CPC ....... *G02B 6/12004* (2013.01); *H04B 10/116* (2013.01); *G02B 2006/12195* (2013.01)

(56) References Cited

U.S. PATENT DOCUMENTS

| | | | | |
|---|---|---|---|---|
| 5,910,012 | A * | 6/1999 | Takeuchi | ........... G02B 6/12004 438/681 |
| 7,061,949 | B1 | 6/2006 | Zhou et al. | |
| 9,921,453 | B2 | 3/2018 | Tiecke et al. | |
| 2009/0129726 | A1 | 5/2009 | Hyde | |
| 2010/0065726 | A1 * | 3/2010 | Zhong | ................ G01N 21/6428 250/227.24 |
| 2014/0362577 | A1 * | 12/2014 | Ide | ........................ G02F 1/0147 362/259 |
| 2015/0244457 | A1 * | 8/2015 | O'Brien | ............. H04B 10/1141 398/118 |
| 2016/0142660 | A1 * | 5/2016 | Shen | ................. H01L 27/14621 438/69 |
| 2017/0346556 | A1 * | 11/2017 | Tiecke | ................... H04B 10/25 |
| 2018/0062766 | A1 | 3/2018 | Ooi et al. | |
| 2018/0312754 | A1 | 11/2018 | Pan et al. | |
| 2019/0044618 | A1 | 2/2019 | Collins | |

OTHER PUBLICATIONS

International Search Report in corresponding/related International Application No. PCT/IB2020/051392, dated Jul. 27, 2020.
Written Opinion of the International Searching Authority in corresponding/related International Application No. PCT/IB2020/051392, dated Jul. 27, 2020.
Zheng, W., et al., "Near-Infrared-Triggered Photon Upconversion Tuning in All-Inorganic Cesium Lead Halide Perovskite Quantum Dots," Nature Communications, Aug. 27, 2018, 9, Article No. 3462, pp. 1-9.

* cited by examiner

LARGE-AREA WAVEGUIDED PHOTODETECTION FOR OPTICAL WIRELESS COMMUNICATION

CROSS-REFERENCE TO RELATED APPLICATIONS

This application is a U.S. National Stage Application of International Application No. PCT/162020/051392, filed on Feb. 19, 2020, which claims priority to U.S. Provisional Patent Application No. 62/808,585, filed on Feb. 21, 2019, entitled "LARGE-AREA WAVEGUIDED PHOTODETECTION WITH WAVELENGTH UP- AND DOWN-CONVERSION FOR HIGH-SPEED OPTICAL WIRELESS COMMUNICATION," the disclosures of which are incorporated herein by reference in their entirety.

BACKGROUND

Technical Field

Embodiments of the subject matter disclosed herein generally relate to a system and method for ultraviolet and visible light communication, and more particularly, to a large-area waveguided photodetection with wavelength up- or down-conversion for high-speed optical wireless communication.

Discussion of the Background

In recent years, optical wireless communication (OWC) has received significant attention owing to its untapped wavelength spectrum, i.e., from 200 nm to 800 nm, that would be able to mitigate the saturated bandwidth in microwave and millimeter wave communication channels. By complementing the existing network infrastructure, OWC could provide greater global connectivity, higher capacities, and secure end-to-end communication for future new and evolving internet services, applications, as well as trillions of internet-of-things (IoT) devices. Emerging as an alternative to many indoor and outdoor applications, e.g., high-definition video streaming, vehicle-to-vehicle communication, and underwater wireless optical communication, OWC of up to tens of Gbps transmission rate have been achieved.

On the transmitter side, advancement of high-modulation-bandwidth (up to GHz) and low-cost light sources, such as light-emitting-diode (LED) and laser diode (LD), has enabled the development of this technology [1].

However, on the receiver side, the progress of the technology did not keep up with the transmitter side. Although high-modulation-bandwidth (up to a few hundreds of MHz) photodetectors and avalanche photodetectors had been commercialized, typically the active area of these detectors is limited to only a few tens of millimeters-square (mm$^2$) owing to the constraint in resistance and capacitance (RC) time constant. For such situations, pointing, acquisition, and tracking (PAT) of the transmitted optical beam is strictly required. This is more severe for underwater wireless optical communication (UWOC) [2], where the light beam is strongly scattered, particularly in the ultraviolet (UV) to near-visible wavelength region, due to the water medium. Ultimately, these limitations of the existing receivers impede the development of a stable and reliable OWC link between various vehicles and systems, as well as for various applications of interest.

In addition, the Internet-of-Things (IoT) is putting more pressure on the existing communication infrastructure as each known device is now being connected to the Internet. For example, common devices such as TVs, microwaves, refrigerators, and vehicles will be non-stop connected to the Internet, requiring even more resources, either from the devices themselves or from the supporting network infrastructure. Considering this scenario, the increasing crowding of the electromagnetic spectrum band allocated to the Wi-Fi becomes a serious problem that needs to be solved as the existing infrastructure cannot provide the appropriate resources for wireless communication.

Thus, new technologies need to be developed to alleviate the spectrum crunch experienced by the Wi-Fi spectrum. Among the new technologies that appear fit to solve the problem of the Wi-Fi spectrum crunch, the optical wireless communication, which includes ultraviolet and Visible Light Communication (VLC), appears to be the most promising. This is so because such form of wireless optical communication can be used together with the existing radio frequency systems, and because of the use of frequencies much higher than those used in the WiFi devices, which allows wireless communications at very high speeds (theoretically in the order of terabytes/s).

Thus, there is a need for a new, large-area, waveguided, ultraviolet and visible light photodetection system that is capable to avoid the pointing, acquisition and tracking of the transmitted optical beam experienced by the existing receivers.

BRIEF SUMMARY OF THE INVENTION

According to an embodiment, there is a large-area, waveguide-based, high-speed ultraviolet and visible light photodetector system for optical wireless communication. The system includes a substrate; plural, parallel, waveguides formed directly on the substrate and including a high quantum-yield wavelength-converting material of semiconductor nature; an optical coupling system optically connected to each one of the plural, parallel, waveguides; and a photodetector optically connected to the optical coupling system and configured to detect an outgoing light. The wavelength-converting material converts a first wavelength of an incoming light at high-speed, received by the plural, parallel, waveguides, into a second wavelength of the outgoing light. The first wavelength is different from the second wavelength, and the first and second wavelengths are between 200 and 800 nm.

According to another embodiment, there is a large-area, waveguide-based, high-speed ultraviolet and visible light photodetector system for optical wireless communication. The system includes a substrate; a waveguide formed with a first face directly on the substrate and having a first taper part and a second ridge part, wherein a surface area of the first taper part is larger than a surface area of the second ridge part; a first wavelength-converting material formed over a second face of the waveguide; a top-coupler layer formed over the first wavelength-converting material; and a photodetector optically connected to the second ridge part of the waveguide. The first wavelength-converting material converts a first wavelength of an incoming light, received by the first taper part of the waveguides, into a second wavelength of an outgoing light that is received by the photodetector. The first wavelength is different from the second wavelength, and the first and second wavelengths are between 200 and 800 nm.

According to still another embodiment, there is a large-area, waveguide-based, ultraviolet and visible light photodetector system for optical wireless communication. The system includes a flexible substrate configured to bend; plural waveguides formed on the substrate, the plural waveguides including a high-speed wavelength-converting material of high quantum yield of more than 50% configured to receive an incoming light; an optical coupling system optically connected to the plural waveguides; and a photodetector optically connected to the optical coupling system and configured to detect an outgoing light. The wavelength-converting material converts a first wavelength of the incoming light into a second wavelength of the outgoing light, the first wavelength is different from the second wavelength, and the first and second wavelengths are between 200 and 800 nm.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
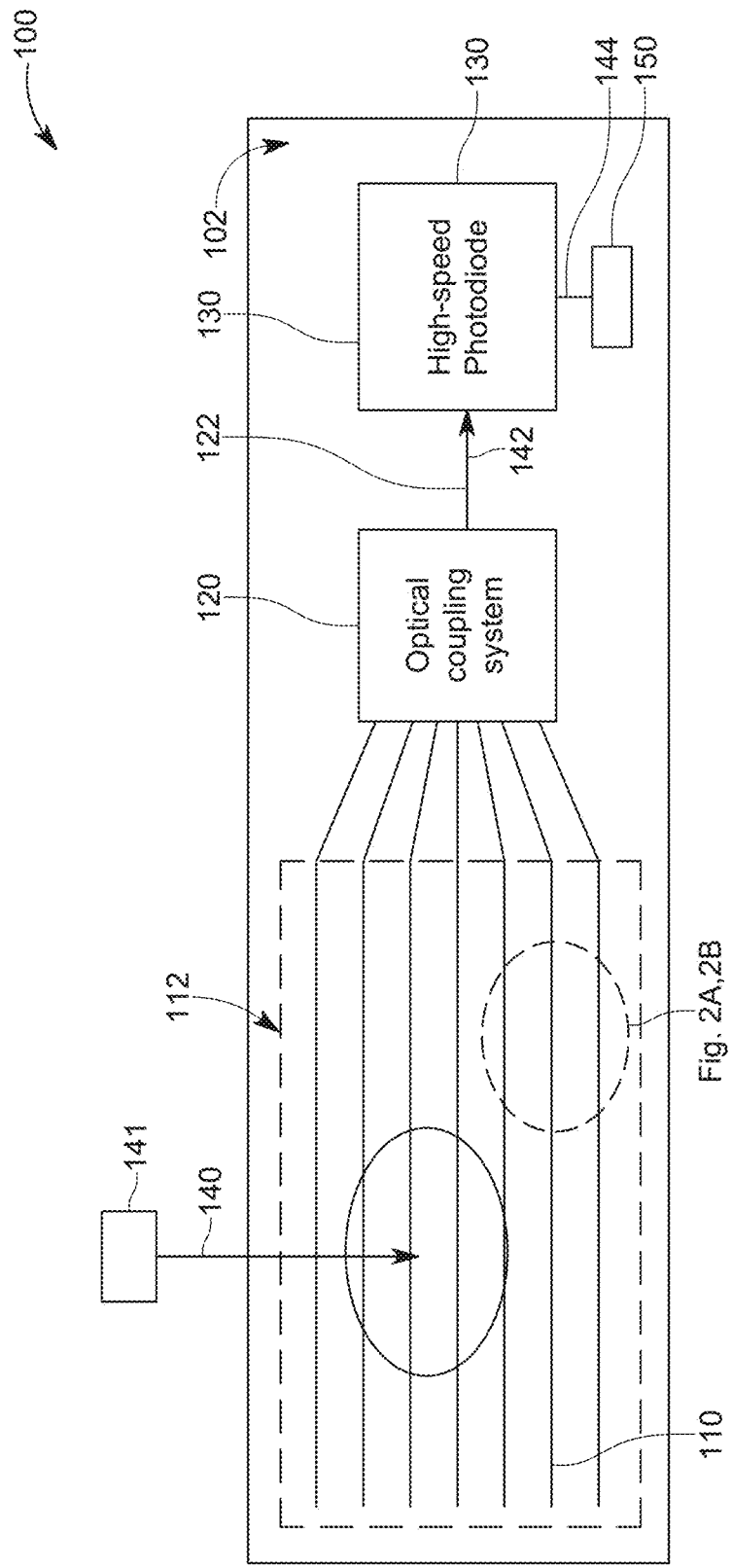
FIG. 1 is a schematic diagram of a wireless light communication system that uses a wavelength-converting material in a waveguide.

The following description of the embodiments refers to the accompanying drawings. The same reference numbers in different drawings identify the same or similar elements. The following detailed description does not limit the invention. Instead, the scope of the invention is defined by the appended claims.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a system and method for large-area waveguided ultraviolet and visible light photodetection is discussed using a wavelength up- or down-converting material. The system relieves the strict requirement in pointing, acquisition and tracking due to the large-area of the waveguide. In one application, the large-area waveguided ultraviolet and visible light photodetection system that includes the wavelength up- or down-converting material may be monolithically integrated onto existing 2D photonics platform or 3D structures for omnidirectional photodetection. The systems discussed herein are capable to achieve high-speed optical wireless communication The systems and associated methods discussed herein offer scalable, ultra-large, detection area for the receiver side, of up to centimeter-square ($cm^2$), while maintaining large modulation bandwidth of up to a few hundreds of MHz, governed by the lifetime of the wavelength up- or down-converting material. With a large detection area, such a receiver system relieves the strict requirement on PAT in an extreme scenario, e.g., strong light scattering in underwater environment, search and rescue mission, and tactical operations. The waveguided photodetection system could also be monolithically integrated on existing on-chip photonics platforms.

The modulated light absorbed by the wavelength up- or down-converting material is shifted into another wavelength and can undergo multiple total internal reflections in the core layer of the waveguide before being coupled onto the photodetector or avalanche photodetector. For instance, by using a tailored fluorescence material as the wavelength down-converting material, such as an organometal halide perovskite-based material [3], it would be possible to absorb photons of higher energy of up to deep-ultraviolet wavelength region. This new system obviates the existing costly path of ultrawide bandgap materials and doping development for UV-based photodetectors.

In another embodiment, the large-area waveguided photodetection system that uses the wavelength up- or down-converting material is configured to be bent and mounted on a 3D surface for high-speed, large-area, and omnidirectional photodetection. These systems are now discussed in more detail with regard to the figures.

According to an embodiment, as illustrated in FIG. 1, a large-area waveguide-based photodetector system 100 includes a platform/substrate 102 on which plural waveguides 110 are formed. This system illustrates the concept of hybrid and monolithic integration of the large-area waveguided photodetection using a wavelength up- or down-converting material on matured silicon-based photonics platform 102.

The substrate 102 can be a simple Si-based substrate. However, in one embodiment, the substrate 102 can be a more complex material that is currently used in the electronic industry. For example, the substrate 102 of the system 100 may include a silicon-based photonics platform, polydimethylsiloxane (PDMS), poly(methyl methacrylate) (PMMA), and/or quartz.

The substrate 102 may be configured to hold an optical coupling system 120 that is optically connected through an optical link 122 to a photodetector 130, for example, a high-speed photodiode. A high-speed is considered herein to be between 0.1 to 10 Gbit/s. Plural waveguides 110 may be formed directly on the substrate 102 and are configured to be optically connected to the optical coupling system 120, as illustrated in FIG. 1.

Figure 2A:
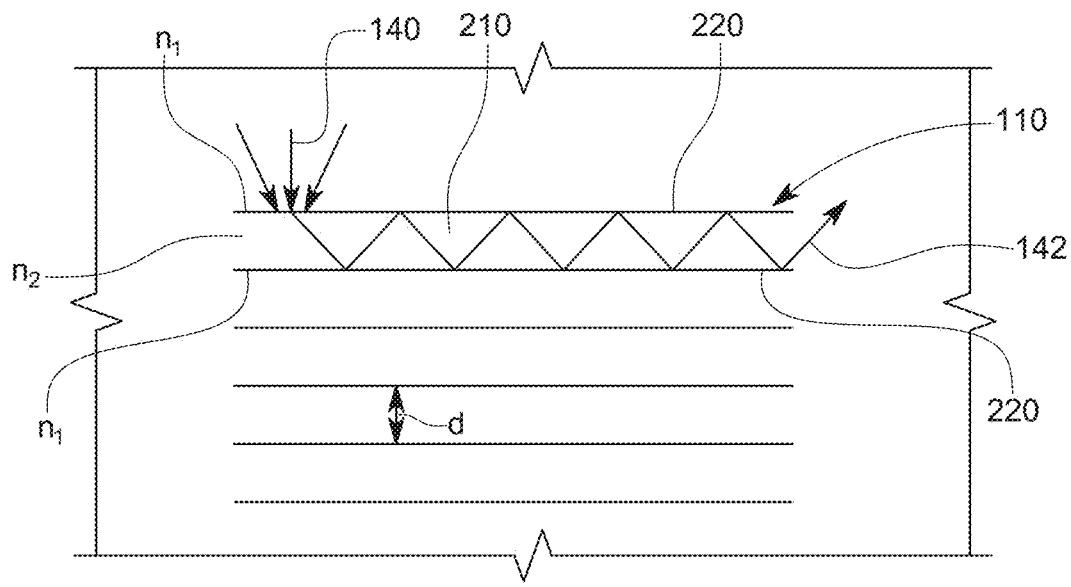
FIG. 2A shows a top view of the wireless light communication system and FIG. 2B shows a cross-section of a waveguide.
Figure 2B:
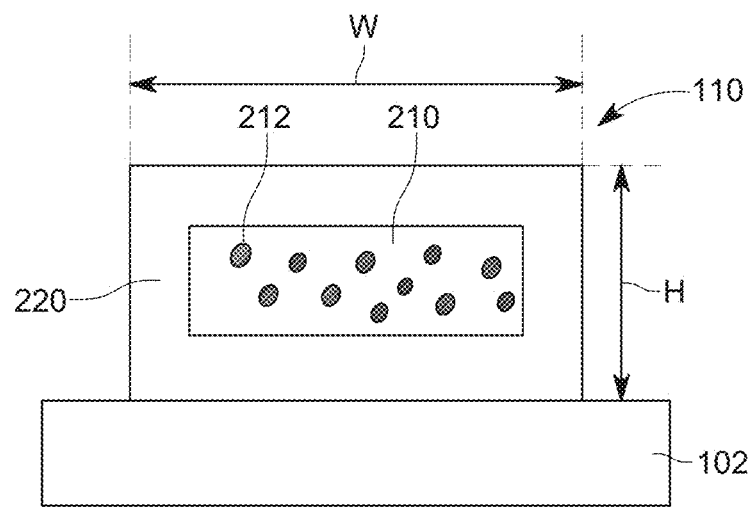

A top view of a few of the waveguides 110 is shown in FIG. 2A, and each waveguide 110 has a core layer 210 and a cladding layer 220, as shown in the cross-sectional view of FIG. 2B. In this embodiment, the plural waveguides 110 are made to be parallel to each other on the substrate 102. However, the waveguides may be made to not be parallel to each other, as discussed later. Note that in this embodiment, the cladding layer 220 is formed directly onto the substrate 102, and the core layer 210 is formed above this part of the cladding layer. The cladding layer is configured to fully enclosed the core layer. The width W and height H of the waveguide 110 is selected based on the wavelength of the incoming and outgoing lights 140 and 142, and also based on the refractive indices of the core and cladding layers. A distance d between two adjacent waveguides 110 can be in the nanometers to millimeters range. In one application, the size of the waveguide is in the nanometer to micrometer range.

The cladding layer 220 has an index of refraction $n_1$ while the core layer has a different index of refraction $n_2$. Modulated incoming light 140 having a first wavelength ($\lambda_1$) is shown in FIG. 1 impinging on the plural waveguides 110. The incoming light 140 is generated by a source light 141. The source light 141 may be a laser diode, a light emitting diode, an incoherent light source, etc. As shown in FIG. 2A, the incoming light 140 is absorbed by the perovskite-doped core layer 210, which would then re-emit, at a shorter or longer wavelength ($\lambda_2$) than the incoming light, depending on the selected up- or down-conversion material 212, an output light 142.

Due to the difference in the refractive index between the cladding layer 220 and the core layer 210, where $n_2 > n_1$, the wavelength-converted light 142 would propagate along the core layer 210 in the waveguide mode (see FIG. 2A) and couple onto the optical coupling system 120 (see FIG. 1). In one embodiment, the optical coupling system 120 can include, but is not limited to, N-to-1 star coupler or any other type of couplers. The output from the optical coupling system 120 is then guided along a silicon-based waveguide 122 into the high-speed silicon-based photodiode 130. In the embodiment, the detection area 112 formed by the perovskite-doped core layer 210 and the cladding layer 220 of the plural waveguides 110 could be arranged similar to that of a ribbon fiber, which is scalable up to an area in the range of centimeter-square (cm$^2$), depending on the number of the waveguides, their sizes, and the distance between the adjacent waveguides.

The wavelength converting material 212 that is doping the core layer 210 is based on a perovskite material. In one application, the wavelength converting material 212 includes an organometallic or inorganic halide perovskite with the general formula of AMX$_3$, where A stands for an organic component like CH$_3$NH$_3$ or inorganic component like Cs, M stands for an alkali metal, like Pb, and X stands for a halide, like Cl, Br or I. In one application, the wavelength converting material is selected to have a photoluminescence (PL) decay lifetime of less than 10 ns. A possible wavelength converting material is disclosed in [4] as being CsPbX$_3$ perovskite quantum dots (PeQDs) having lanthanide-doped nanoparticles (NPs). Other materials may also be used. In one application, the organometallic or inorganic halide perovskite is a high quantum yield, for example, between 50 and 100%. In one application, the high quantum yield is above 50%.

In the embodiment of FIG. 1, the incoming light 140 and the wavelength-converted light 142 can have a wavelength in the UV to visible wavelength region, i.e. 200 nm to 800 nm. In this application, the UV wavelength spectrum is considered to be between 200 and 380 nm and the visible spectrum to be between 380 and 800 nm. Note that the perovskite-doped waveguide discussed in this embodiment differs from the erbium-doped fiber amplifier (EDFA) that operates at the 1550 nm wavelength region, at least in the fact that the EDFA waveguide cannot operate in the UV or visible light spectrum.

The system 100 may also include additional electronics 150, either directly formed on the substrate 102, or next to the substrate, which is configured, for example, to receive an electrical signal generated by the photodiode 130, and to decode information that was encoded in the incoming optical light 140. In this regard, note that the incoming light 140, although experiencing a wavelength change in the perovskite-doped core layer 210, still maintains the integrity of the encoded information. Thus, the wavelength-converted light 142, after being detected by the photodiode 130, is transformed into an electrical signal 144, which is provided to the electronics 150 for decoding. The electronics 150 may include a processor, a memory, and other components associated with data communication.

With this system, it is possible to receive the incoming light 140 having a first wavelength, to transform with the wavelength-converting material 212 the first wavelength to a second wavelength, depending on the sensitivity of the photodiode 130, and then to supply the output light 142, having the second wavelength, to the photodiode 130 for detection and decoding. In this way, the system 100 transforms the wavelength of the incoming light to a desired wavelength to which the photodiode is most sensitive. For example, it is possible to have the first wavelength in the UV range and the second wavelength in the visible range. In another embodiment, both the first and second wavelengths are in the visible range or the UV range, but they are different from each other. In still another embodiment, the first wavelength is larger than the second wavelength. In yet another embodiment, the first wavelength is smaller than the first wavelength.

Figure 3A:
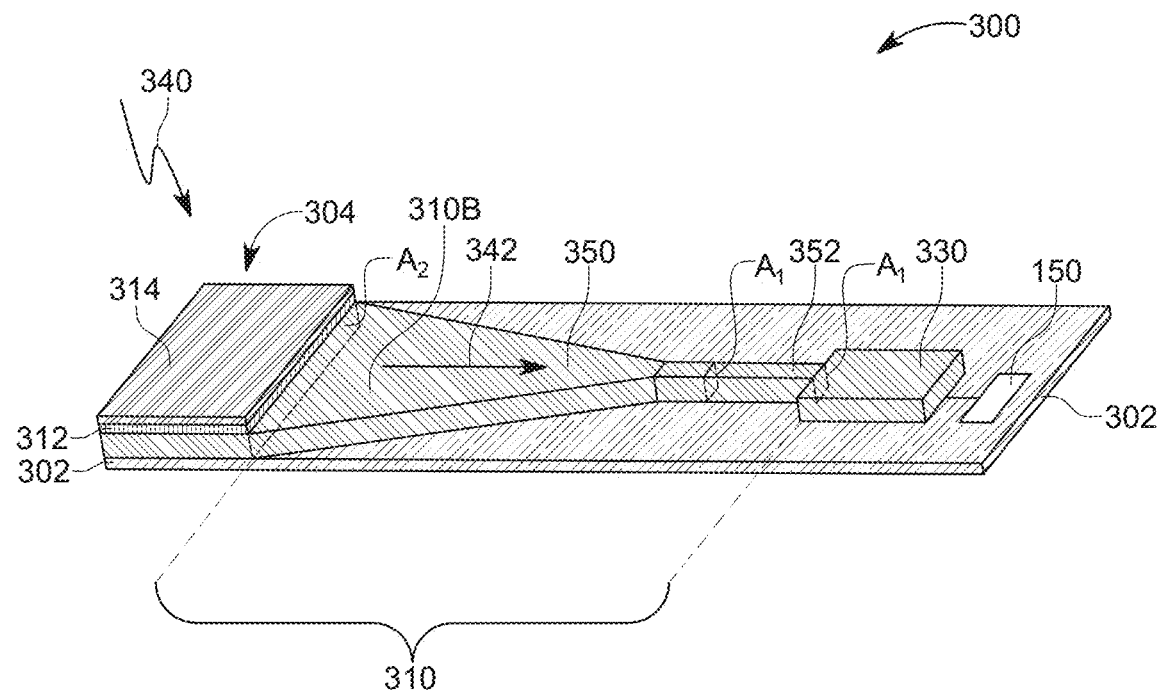
FIG. 3A shows another wireless light communication system that uses a wavelength-converting material located over a waveguide and FIG. 3B shows a cross-section of the wavelength-converting part of the system.

Another large-area, waveguide-based, photodetector system is now discussed with regard to FIGS. 3A to 4B. FIG. 3A shows a large-area, waveguide-based, receiving system 300 that is formed on a substrate 302, similar to the substrate 102. The large-area, waveguide-based, receiving system 300 is monolithically integrated with the substrate 302. In this regard, the large-area waveguide receiving region 304 is configured to receive the incoming light 340, having a first wavelength. The receiving region 304 includes a wavelength-converting layer 312 which is configured to up-convert or down-convert the first wavelength to a second wavelength, of the output light 342. In one application, the process of up-converting the wavelength is achieved through multi-photon absorption and the process of down-converting the wavelength is achieved through photoluminescence, i.e., optical bandgap transition. The output light 342 propagates through the waveguide 310 to a high-speed photodetector 330, which is located on the substrate 302, as illustrated in FIG. 3A.

The waveguide 310 is shaped in this embodiment as a wedge because the large-area region 304 has a top surface area larger than a top surface area of the photodetector 330.

Thus, to converge all the light beams that are produced inside the large-area region 304, the waveguide 310 is shaped as a funnel to that a cross-section area A1 of the downstream end of the waveguide matches the cross-section area A1 of the photodetector 330. However, the upstream cross-section area A2 of the waveguide 310 is much larger than the downstream area A1. In one application, A2 is at least double A1. In another application, A2 is at least ten times A1.

Figure 3B:
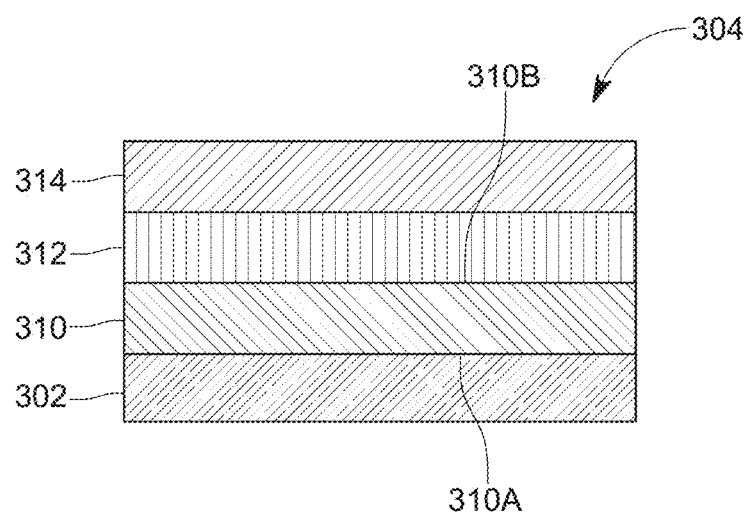

The receiving region 304, which is illustrated in more detail in FIG. 3B, which is a cross-section, further includes a top-coupler layer 314, formed over the wavelength-converting material 312. The wavelength-converting material 312 is formed over a second side 310B of the waveguide 310, and the waveguide 310 is formed with a first side 310A over the substrate 302. In one embodiment, these layers are formed directly on top of each other as illustrated in FIG. 3B. Thus, in this embodiment, the waveguide 310 is not doped with the wavelength-converting material, but rather the wavelength-converting material is formed as a separate layer 312, directly over the waveguide 310. The top-coupler layer 314, which is formed directly over the wavelength-converting layer 312, is configured to focus the incoming light 340 to the wavelength-converting layer 312. In one application, the top-coupler layer 314 may include microlenses or photonics crystal structures for achieving this functionality.

When in use, the modulated incoming light 340 having the first wavelength $\lambda_1$ is absorbed by the wavelength-converting layer 312. The wavelength-converting layer 312, is similar to the wavelength-converting material 212. The wavelength-converting layer 312 re-emits the energy of the incoming light 340 as the outgoing light 342, at a shorter or longer second wavelength $\lambda_2$ than the incoming light, depending whether the up- or down-converting material is used. The wavelength-converting material can be embedded in a polymer/polyimide/benzocyclobutene (BCB) layer for protection. The wavelength-converted light 342 is then coupled to a high refractive index material (e.g., $Si_3N_4$), which forms the waveguide 310, via evanescent wave coupling (i.e., a connection between a low refractive index polymer to the high refractive index $Si_3N_4$ structure).

The waveguide 310 can have an adiabatic taper part 350 connected to a ridge part 352. The taper part 350 has the cross-section surface area much larger than the ridge part 352. The output from the adiabatic taper is then guided along the ridge waveguide part 352 into a small-aperture, high-speed, silicon-based photodetector 330. In one application, the waveguide 310 has a higher refractive index than the refractive index of the substrate 302. In this embodiment, the incoming light 340 and the wavelength-converted light 342 have a wavelength in the UV to visible wavelength region, i.e., 200 nm to 800 nm. In one embodiment, the substrate may include polydimethylsiloxane (PDMS), poly(methyl methacrylate) (PMMA), and/or quartz.

Figure 4A:
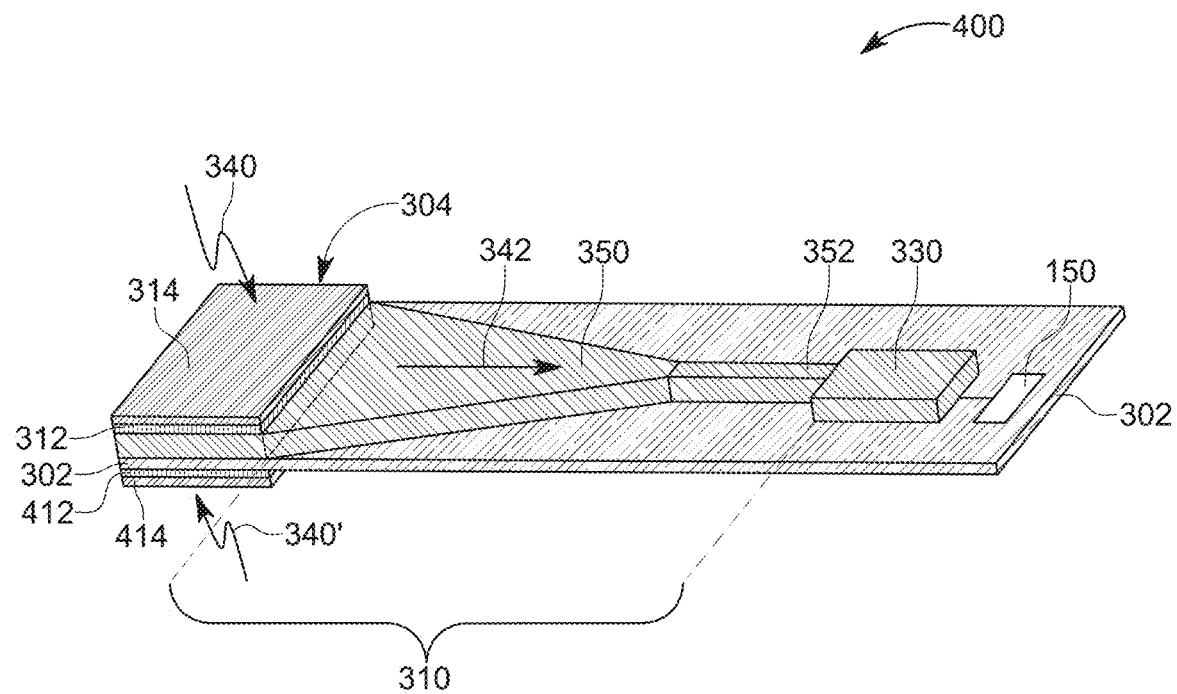
FIG. 4A shows yet another wireless light communication system that uses a first wavelength-converting material over a waveguide and a second wavelength-converting material over a substrate of the waveguide.
Figure 4B:
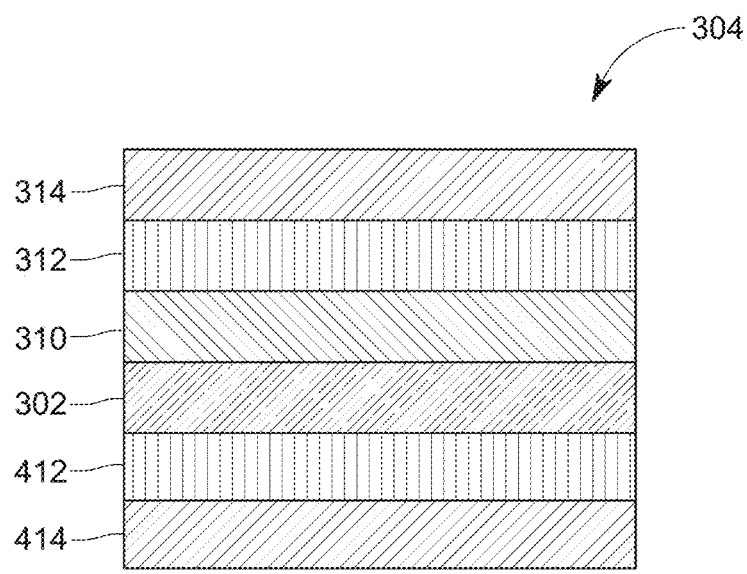
FIG. 4B shows a cross-section of the wavelength-converting part of the system.

In a variation of the receiving system 300, as illustrated in FIGS. 4A and 4B, another receiving system 400 includes not only a top-coupler layer 314 and a top wavelength-converting layer 312, but also a bottom-coupler layer 414 and a bottom wavelength-converting layer 412. The top wavelength-converting layer 312 is formed in this embodiment directly over the waveguide 310 while the bottom-converting layer 412 is formed directly on a side of the substrate 302, opposite to the waveguide 310. In other words, the top- and bottom-converting layers are formed on opposite sides of the waveguide 310. The top- and bottom-coupler layers sandwich the entire large-area receiving region 304, as best illustrated in FIG. 4B.

When the bottom-coupler layer 414 is included, the substrate 302 is selected to have a transparency higher than 80% to the incoming light, e.g., the substrate is made of PDMS, PMMA, and/or quartz, so that the additional incoming light 340' could also be coupled and converted by the bottom-coupler layer 414 and the wavelength-converting layer 412 before being guided along the waveguide 310 to the high-speed photodetector 330. Note that the additional incoming light 340' needs in this case to also pass the substrate 302 before entering the waveguide 310.

In this embodiment, the incoming light 340 and 340' has a wavelength from the UV to the visible wavelength region, i.e., 200 nm to 800 nm. For implementing the wavelength up-converting layer, both the structures in FIGS. 3A and 4A could be used. The output from the adiabatic taper part 350 is then guided along the ridge waveguide part 352 into the small-aperture, high-speed, silicon-based or SiGe-based photodetector 330.

Figure 5A:
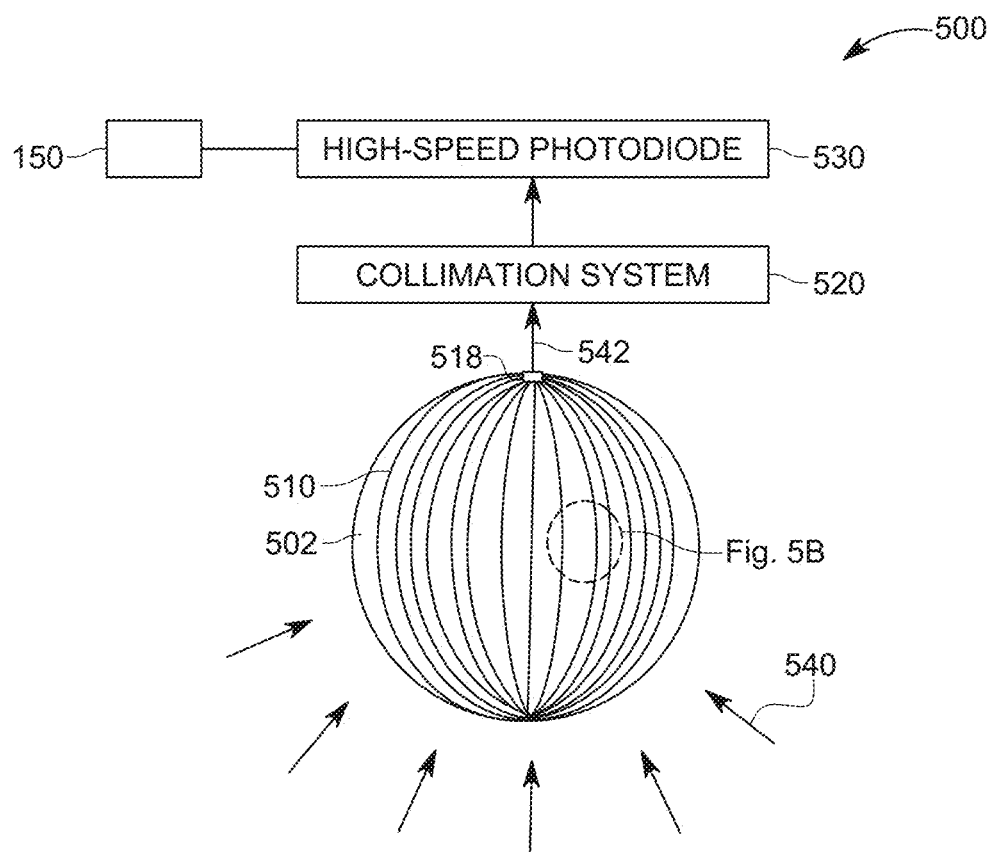
FIG. 5A shows an omnidirectional wireless light communication system that uses plural waveguides distributed over a 3D shaped substrate and FIG. 5B illustrates a top view of the waveguides before the substrate takes the 3D shape.

The large-area, waveguide-based, photodetector systems discussed above can be further modified to achieve an omnidirectional, waveguide-based, photodetector system 500, as illustrated in FIG. 5A. In this embodiment, the waveguides 510 are made on a flexible substrate 502, for example, rubber or a similar highly-bendable and stretchable material. The flexible substrate 502 is shaped, in this embodiment, as a sphere that can be achieved with an inflatable balloon. However, the flexible substrate may be shaped in another 3D shape, for example, an ovoid, a prolate or oblate spheroid, or other similar shape. After the formation of the waveguides 510 on the substrate, the substrate 502 is inflated to achieve its 3D shape, which is a sphere in this case. The waveguides 510, which are very thin (in the order of nanometers to millimeters) and initially they are substantially parallel to each other (when the substrate has a 2D shape), are flexible enough to bend to follow the contour of the substrate 502 when assuming its 3D shape.

Figure 5B:
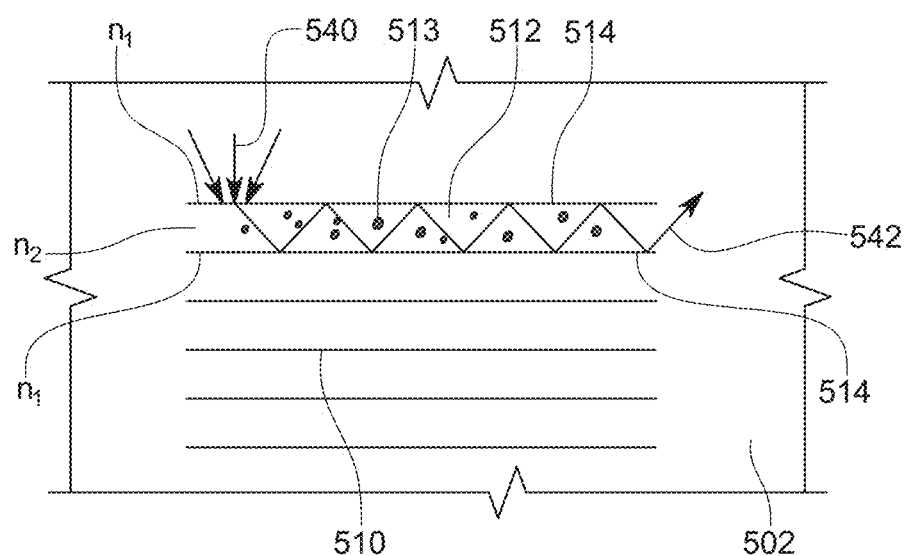

When the substrate is transformed to have the 3D shape, the waveguides 510 are located around the spherical substrate 502, as the meridians of the Earth, i.e., as circles that have common points at the two poles of the sphere. Each waveguide 510 has a structure similar to the waveguide 110, i.e., includes a core layer 512 and a cladding layer 514, and the core layer 512 includes a wavelength-converting material 513 which converts up or down the wavelength of the incoming light 540, as illustrated in FIG. 5B. The incoming light 540 enters directly through the cladding layer 514 into the core layer 512, as also shown in FIG. 5B. The wavelength-converted outgoing light 542 from each waveguide 510 enters a coupler 518, which is connected to each waveguide 510 and placed at one of the poles of the substrate 510. The coupler 518 aggregates the wavelength-converted outgoing lights 542 received from the waveguides 510, and transmits this aggregated light to a collimation system 520, which is configured to collimate the light and transmit it to a high-speed photodiode 530. The high-speed photodiode 530 transforms the detected light into an electrical signal and provides this signal to a computing device 150 to which it is connected. The computing device 150 is configured to decode the information carried by the incoming light 540.

In this embodiment, the core layer 512 is doped with wavelength up- or down-converting material 513, which may be an organometallic or inorganic halide perovskite with the general formula of $AMX_3$, as discussed above, and is selected to have a PL decay lifetime of less than 10 ns. These materials are capable to absorb the incoming light having a first wavelength ($\lambda_1$) from all directions (because of the 3D shape of the substrate) and re-emit the light, at a shorter or longer second wavelength ($\lambda_2$), depending on the selected up- or down-conversion process.

The waveguides 510 may be arranged in the form of fiber ribbon or fiber bundle and then guided to the collimation system 520. In one application, the collimation system 520 can include, but is not limited to, aspheric lenses, plano-convex lenses, aspheric fiber collimators. The coupler 518 may be a N-to-1 star coupler or other type of coupler. In one application, the high-speed photodetector can include, but is not limited to, a high-speed Si-based, group III-nitride-based, SiC-based photodiode, or avalanche photodetector. In this embodiment, the high-speed photodetector can decode the transferred data set after converting the optical signal to an electrical signal.

In this embodiment, the incoming light 540 and the wavelength-converted light 542 may have any wavelength from the UV to the visible wavelength region, i.e., 200 nm to 800 nm. In one application, one wavelength is in the UV region and the other wavelength is in the visible spectrum. In another application, both wavelengths are in the UV region, but they have different values. In still another application, both wavelengths are in the visible region, but they have different values. The first wavelength can be larger than the second wavelength. However, it is possible that the first wavelength is smaller than the second wavelength.

Figure 6:
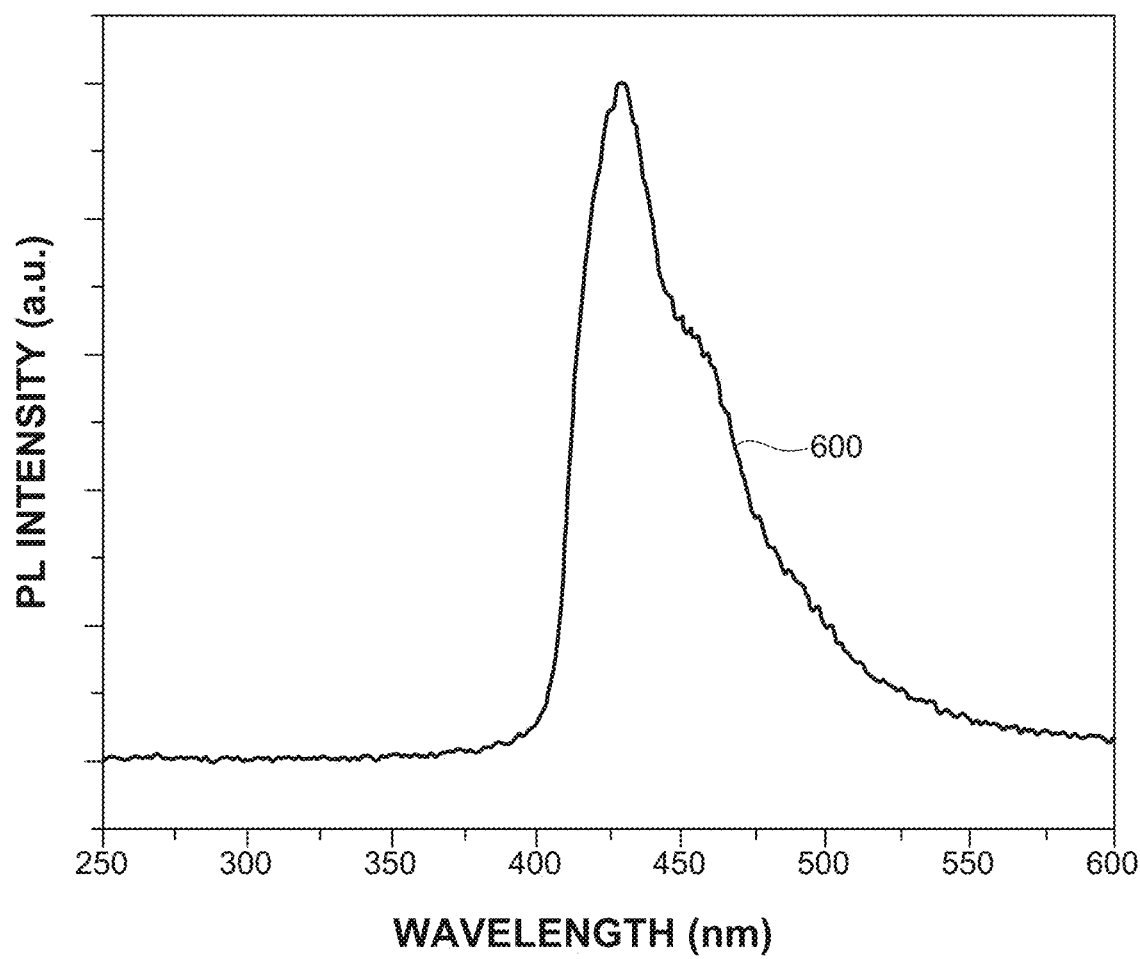
FIG. 6 illustrates the photoluminescence emission from the waveguided photodetection with the wavelength-converting material.

The embodiments discussed above describe photodetection systems that have in common a large-area (in the order of cm²) for detecting the incoming light, while retaining a high 3-dB modulation bandwidth of tens or hundreds of MHz. The photoluminescence emission from the waveguided photodetection with one of the systems discussed above under a 375 nm UV excitation source is illustrated in FIG. 6. The PL emission curve 600 shows a peak wavelength at 430 nm.

Figure 7:
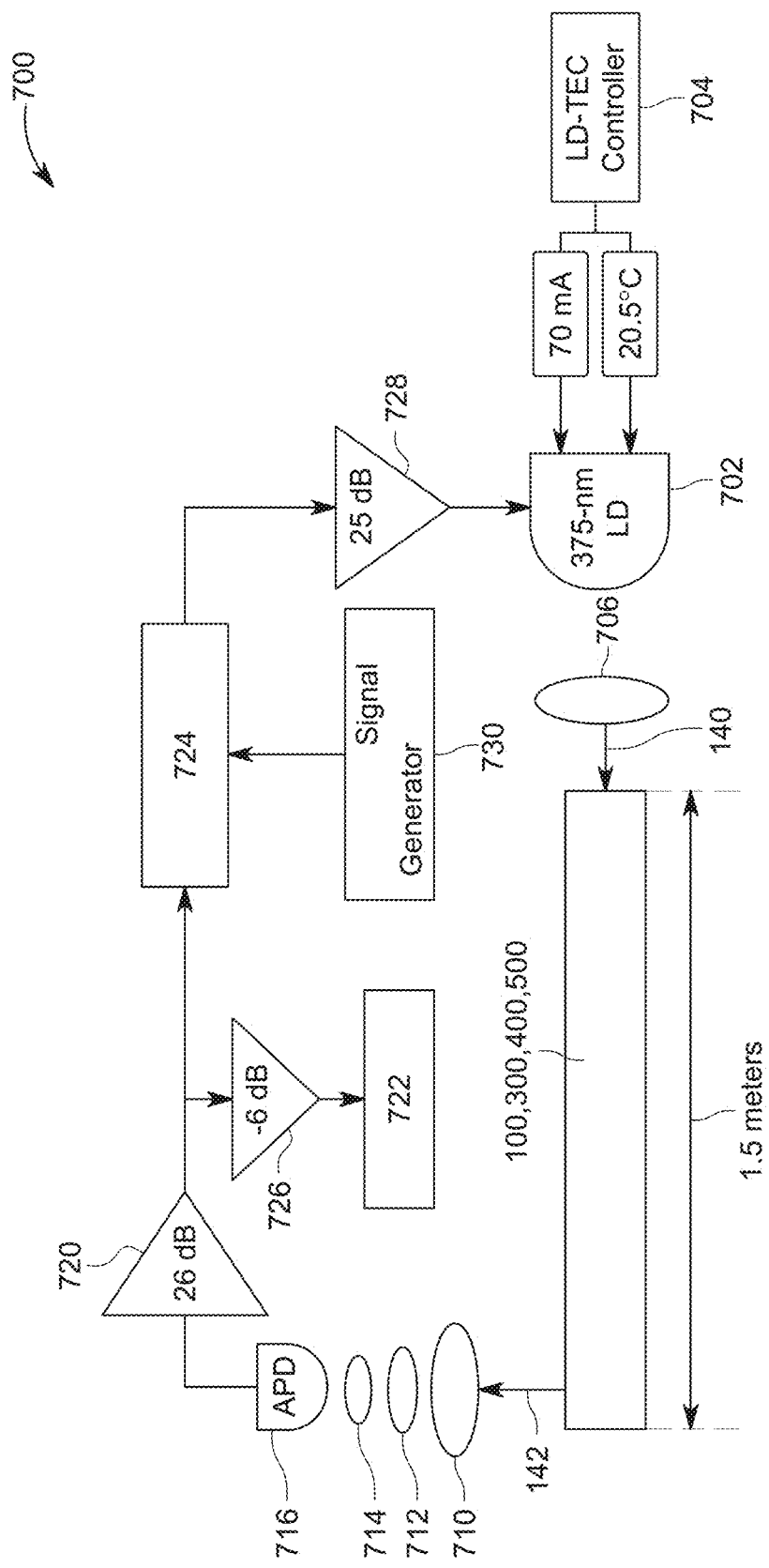
FIG. 7 illustrates a setup for measuring various characteristics of the optical wireless communication systems discussed herein.
Figure 8:
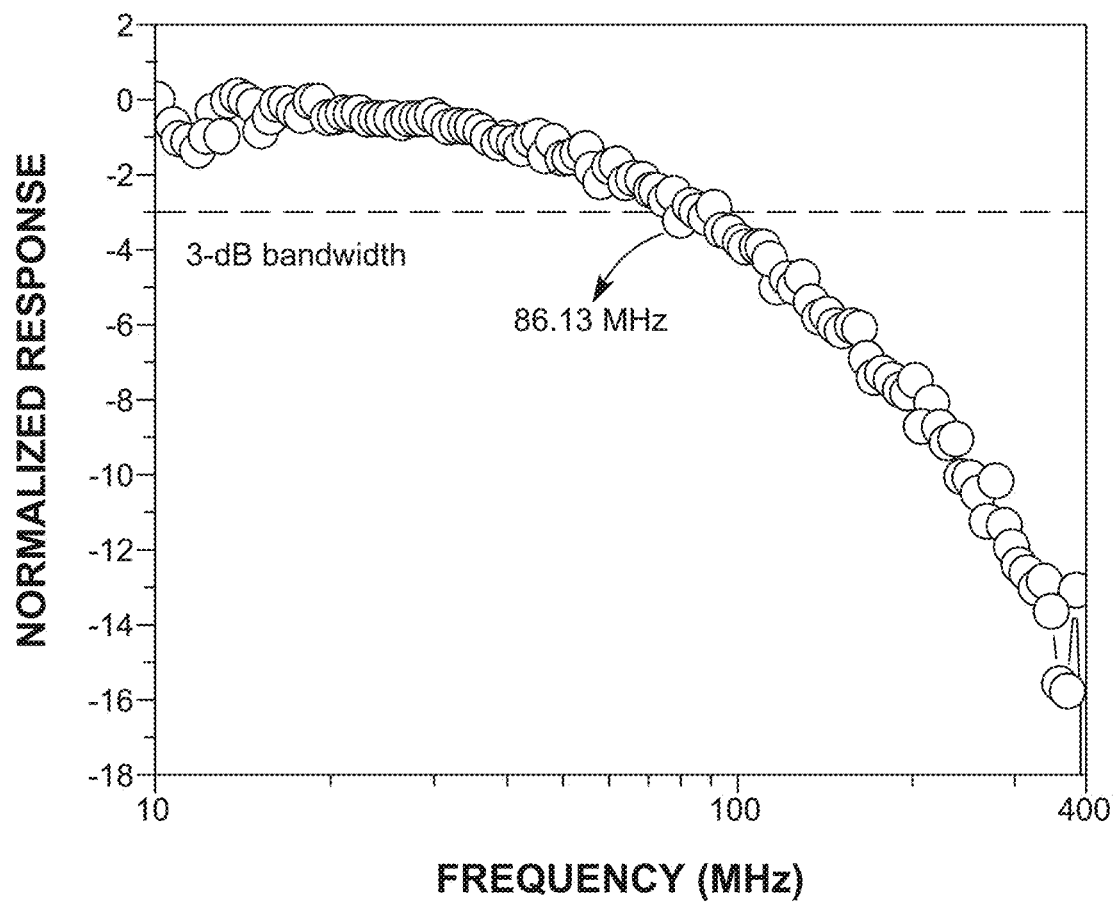
FIG. 8 illustrates the bandwidth of the waveguided photodetection with the wavelength-converting material.
Figure 9:
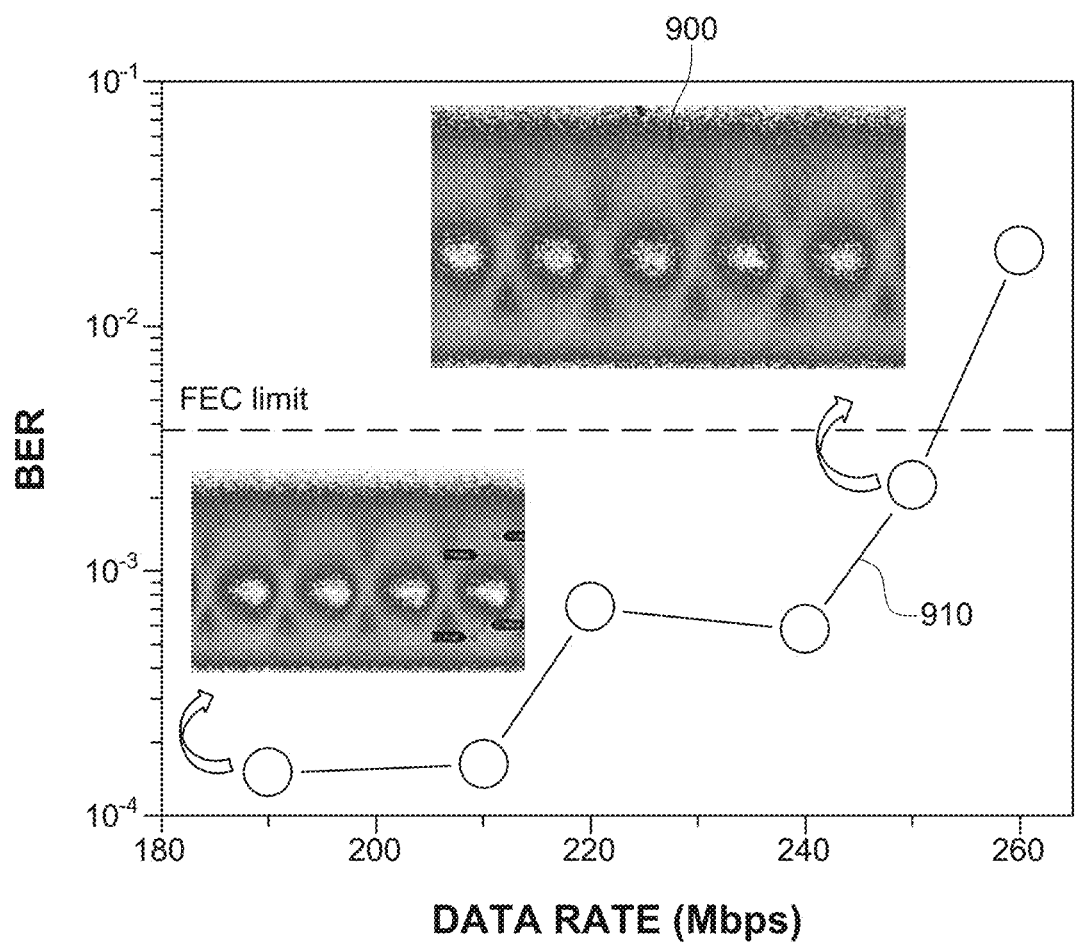
FIG. 9 illustrates the bit-error-rate and achieved data rate using an on-off keying modulation scheme with one of the systems discussed herein.

The bandwidth and bit-error-rate of the systems discussed above were investigated using the setup 700 shown in FIG. 7. More specifically, one of the systems 100, 300, 400, or 500 discussed above has been illuminated with the incoming light 140. The incoming light 140 was generated with laser diode 702 provided with a controller 704, which is configured to control the current supplied to the laser diode and its temperature. The light is then collimated with a collimation lens 706 before being sent to the system 100. The wavelength-converted light 142 existing the system 100 is processed with a condenser lens 710, a 400-nm long pass filter 712, and an objective lens 714, prior to being detected with a photodetector 716. An amplifier 720 is connected to amplify the electrical signal after the optical signal is being converted to electrical signal by the photodetector 716. The electrical signal is then distributed to a high-accuracy oscilloscope 722 for determining the bandwidth of the waveguided photodetection, as illustrated in FIG. 8, and also to a J-BERT device 724 that provides jitter tolerance test for embedded and forward clock device, which is used for characterizing and stressing chips and transceiver module. The output of this device is used to plot, as illustrated in FIG. 9, the bit-error-rate 900 and the achieved data rate 910 using an on-off keying (OOK) modulation scheme in a 1.15-meters long underwater channel using waveguided photodetection with wavelength-converting material as receiver. A data rate of 250 Mbit/s was recorded with BER below the forward-error-correction (FEC) limit, as shown in FIG. 9.

The setup of FIG. 7 also includes attenuator 726, amplifiers 720 and 728, and a signal generator 730.

Figure 10:
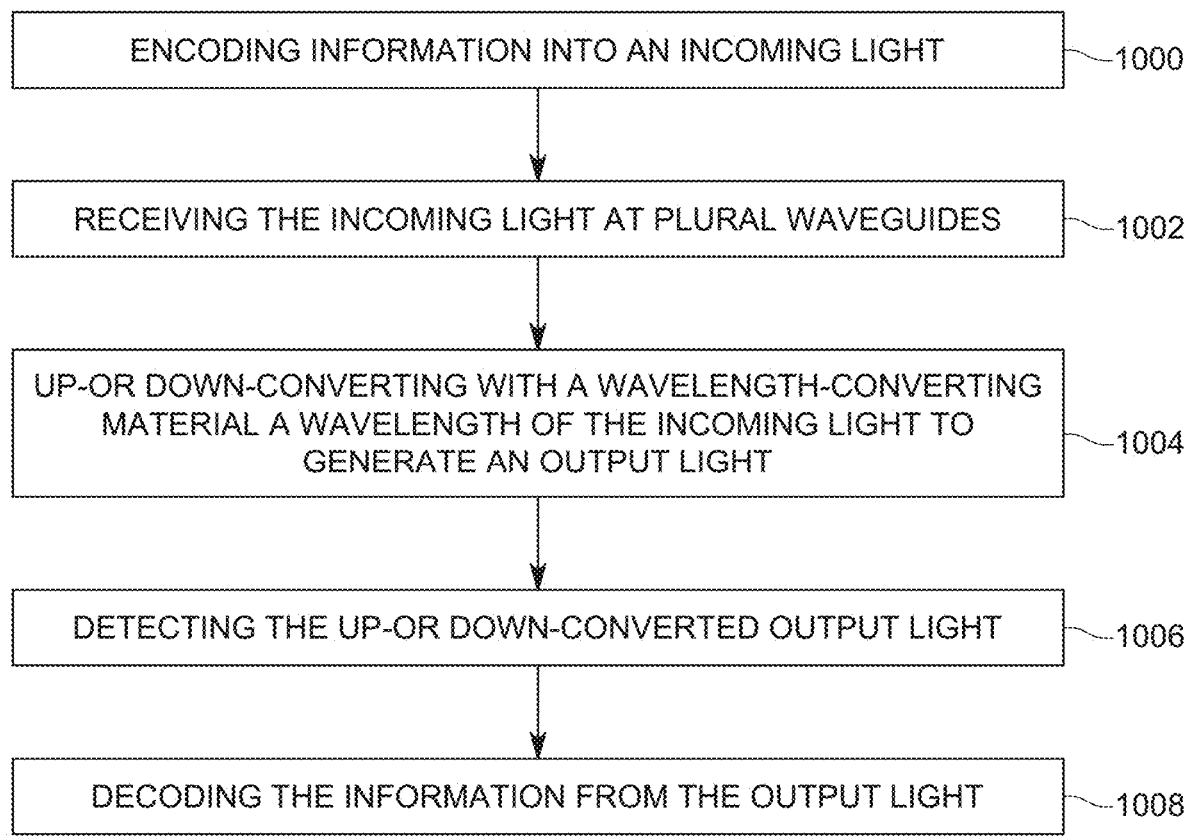
FIG. 10 is a flowchart of a method for exchanging information using an ultraviolet and visible light communication system that uses a wavelength-converting material.

A method for transmitting information using the UV and/or visible light spectrum is now discussed with regard to FIG. 10. One of the systems 100, 300, 400, or 500 discussed above may be used for this type of communication. The information is encoded in step 1000 into an incoming light 140. The light that carries the encoded information may be generated with the light source 141. The incoming light 140 is then received in step 1002 by the plural waveguides 110. The incoming light 140's wavelength is up- or down-converted in step 1004 with a wavelength-converting material 212, with which the waveguides 110 are doped. The wavelength-converted output light 142 is then detected in step 1006 by a photodetector 130, and a computing device 150 decodes in step 1008 the information.

The disclosed embodiments provide a large-area, waveguide-based, photodetector system that uses a wavelength-converting material. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] M. Zhou, D.-c. Sun, K.-s. Tan, and W. Jiang, "Methods, apparatus, and systems with semiconductor laser packaging for high modulation bandwidth," U.S. Pat. No. 7,061,949, 2006.
[2] B. S. Ooi, B. Janjua, C. Shen, H. M. Oubei, and T. K. Ng, "Systems and methods for underwater illumination, survey, and wireless optical communications," U.S. Patent Publication No. 2018/0062766, 2018.
[3] J. Pan, S. P. Sarmah, O. F. Mohammed, and O. M. Bakr, "Air-stable surface-passivated perovskite quantum dots (QDS), methods of making these QDS, and methods of using these QDS," U.S. Patent Application Publication 2018/0312754, 2018.
[4] Zheng et al., Nat. Comm. 9, 3462, 2018.

What is claimed is:

1. A large-area, waveguide-based, high-speed ultraviolet and visible light photodetector system for optical wireless communication comprising:
a substrate;
plural, parallel, waveguides located directly on the substrate and including a high quantum-yield wavelength-converting material of semiconductor nature, wherein a waveguide of the plural, parallel, waveguides includes a core layer fully enclosed by a cladding layer, and the core layer includes the wavelength-converting material;

an optical coupling system optically and directly connected to each one of the plural, parallel, waveguides;

an optical link optically and directly connected to the optical coupling system and configured to guide an outgoing light generated by the plural, parallel, waveguides; and a photodetector optically and directly connected to the optical link and configured to detect the outgoing light, wherein the wavelength-converting material converts a first wavelength of an incoming light at high-speed, received by the plural, parallel, waveguides, into a second wavelength of the outgoing light, wherein the first wavelength is different from the second wavelength, and wherein the first and second wavelengths are between 200 and 800 nm.

2. The photodetector system of claim 1, wherein the incoming light enters directly through the cladding layer into the core layer.

3. The photodetector system of claim 1, wherein the wavelength-converting material is configured to up-convert a wavelength through multi-photon absorption or down-convert a wavelength through photoluminescence.

4. The photodetector system of claim 1, wherein the wavelength-converting material is an organometallic or inorganic halide perovskite of high quantum- yield above 50%.

5. The photodetector system of claim 4, wherein the organometallic or inorganic halide perovskite is selected to have a decay lifetime of less than 10 ns.

6. The photodetector system of claim 1, wherein the wavelength- converting material is selected to convert an ultraviolet wavelength to a wavelength in the 400 to 800 nm range.

7. The photodetector system of claim 1, wherein the incoming light includes encoded information and the outgoing light preserves the encoded information of 0.1-10 Gbit/s.

8. A large-area, waveguide-based, high-speed ultraviolet and visible light photodetector system for optical wireless communication comprising:

a substrate;

a waveguide located with a first face directly on the substrate and having a first taper part and a second ridge part, wherein a cross-sectional surface area of the first taper part is larger than a cross-sectional surface area of the second ridge part;

a first wavelength-converting material located over a second face of the waveguide, on top of the first taper part;

a top-coupler layer located over the first wavelength-converting material; and a photodetector optically and directly connected to the second ridge part of the waveguide;

a second wavelength-converting material formed on a side of the substrate, opposite to a side on which the waveguide is formed; and a bottom-coupler layer formed over the second wavelength-converting material, wherein both the first and second wavelength-converting materials are configured to receive the incoming light from opposite directions, wherein the first wavelength-converting material converts a first wavelength of an incoming light, received by the first taper part of the waveguide, into a second wavelength of an outgoing light that is received by the photodetector, wherein the first wavelength is different from the second wavelength, and wherein the first and second wavelengths are between 200 and 800 nm.

9. The ultraviolet and visible light photodetector system of claim 8, wherein the first wavelength-converting material is configured to up-convert a wavelength through multi-photon absorption or down-convert a wavelength through photoluminescence.

10. The ultraviolet and visible light photodetector system of claim 8, wherein the first wavelength-converting material is an organometallic or inorganic halide perovskite of high quantum yield above 50%.

11. The ultraviolet and visible light photodetector system of claim 10, wherein the organometallic or inorganic halide perovskite is selected to have a decay lifetime of less than 10 ns.

12. The ultraviolet and visible light photodetector system of claim 8, wherein the incoming light includes encoded information and the outgoing light preservers the encoded information of 0.1 to 10 Gbit/s.

13. The ultraviolet and visible light photodetector system of claim 8, wherein the second wavelength-converting material is an organometallic or inorganic halide perovskite of high quantum-yield of more than 50%.

14. The ultraviolet and visible light photodetector system of claim 13, wherein the organometallic or inorganic halide perovskite is selected to have a decay lifetime of less than 10 ns.

* * * * *